United States Patent
Xu et al.

(10) Patent No.: US 6,331,211 B1
(45) Date of Patent: Dec. 18, 2001

(54) METHOD AND APPARATUS FOR FORMING LOW DIELECTRIC CONSTANT POLYMERIC FILMS

(75) Inventors: Chongying Xu, New Milford; Thomas H. Baum, New Fairfield, both of CT (US); Ralph J. Carl, Carmel, NY (US); Edward A. Sturm, New Milford, CT (US)

(73) Assignee: Advanced Technology Material, Inc., Danbury, CT (US)

( * ) Notice: Subject to any disclaimer, the term of this patent is extended or adjusted under 35 U.S.C. 154(b) by 0 days.

(21) Appl. No.: 09/635,866

(22) Filed: Aug. 10, 2000

Related U.S. Application Data

(62) Division of application No. 09/157,966, filed on Sep. 21, 1998, now Pat. No. 6,123,993.

(51) Int. Cl.$^7$ .................................. C23C 16/00
(52) U.S. Cl. ................ 118/719; 118/724; 118/726; 392/399
(58) Field of Search .................... 118/726, 719, 118/724; 392/399

(56) References Cited

U.S. PATENT DOCUMENTS

| | | |
|---|---|---|
| 5,268,202 | 12/1993 | You et al. . |
| 5,902,641 * | 5/1999 | Affinito et al. ............. 427/255.2 |
| 5,958,510 * | 9/1999 | Sivaramakrishnan et al. ...... 118/719 |
| 5,966,499 * | 10/1999 | Hinkle et al. .................. 427/255.1 |

OTHER PUBLICATIONS

Chow, et al., "Poly–($\alpha,\alpha,\alpha,\alpha,$–tetrafluoro–p–xylylene)", J. Appl. Polymer Sci., vol. 13, 1969, pp. 2325–2332.

Gorharn, "A New General Synthetic Method for the Preparation of Linear Poly–P–Xylylenes", J. Polymer, Sci., Part A–1, vol. 19, 1969, pp. 3027–3039.

\* cited by examiner

*Primary Examiner*—Richard Bueker
(74) *Attorney, Agent, or Firm*—Steven J. Hulquist; Robert A. McLauchlan, III

(57) ABSTRACT

A method and apparatus for forming a low dielectric constant polymeric film on a substrate, by liquid delivery of a parylene precursor reagent, in the form of an organic solution or a neat liquid, subsequent flash vaporization of the neat liquid or organic solution, pyrolytic "cracking" of the precursor to form the reactive monomer and/or reactive radical species, and condensation and polymerization of the monomer and/or reactive radical species to form a low dielectric constant polymeric film on the substrate. The low dielectric constant polymeric film may comprise a parylene film, formed from a precursor such as [2.2]paracyclophane, an alkyl- and/or halo-substituted derivative thereof, or an analogous compound of a p-xylene derivative.

12 Claims, 5 Drawing Sheets

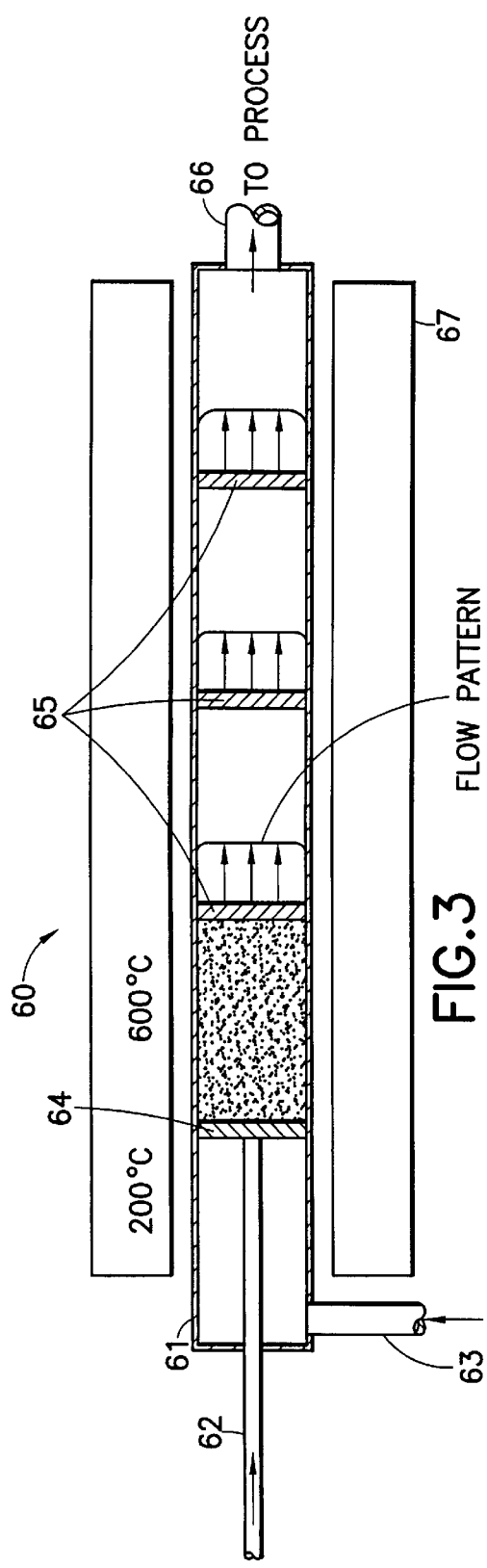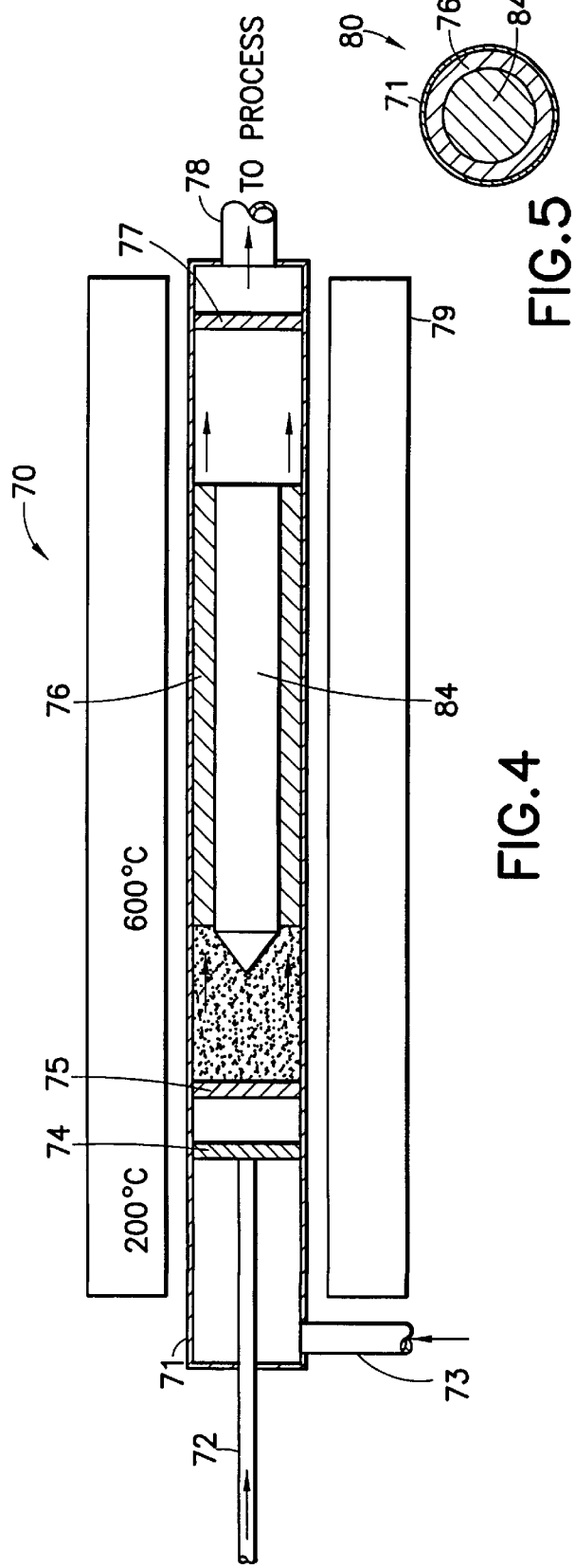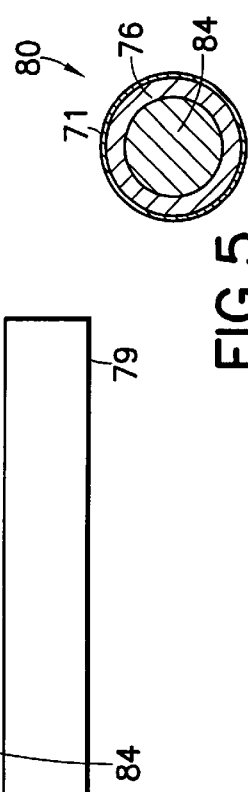
FIG.3
FIG.4
FIG.5

METHOD AND APPARATUS FOR FORMING LOW DIELECTRIC CONSTANT POLYMERIC FILMS

This is a division of U.S. application Ser. No. 09/157,966 U.S. Pat. No. 6,123,993 filed Sep. 21, 1998.

BACKGROUND OF THE INVENTION

1. Field of the Invention

The present invention relates to a method and apparatus for forming low dielectric constant (low k) polymeric films on a substrate, as an interlayer dielectric (ILD) material for fabrication of microelectronic device structures. The low k material may for example comprise parylene or a substituted derivative thereof.

2. Description of the Related Art

Copper currently is of great interest in metallization of very large-scale integration (VLSI) devices, due to its low resistivity, low contact resistance, and ability to enhance microelectronic device performance by reduction of RC time delays.

The concurrent use with copper metallization of a low dielectric constant material likewise provides reduction in the RC time constant, to further enhance device performance.

Among low dielectric constant materials, conventional $SiO_2$ dielectric materials display values of the dielectric constant, k, near 3.2. For lower dielectric constant materials, potential candidate materials include polymers such as parylene as an interlayer dielectric (ILD) material. Some examples of the parylene family are given below:

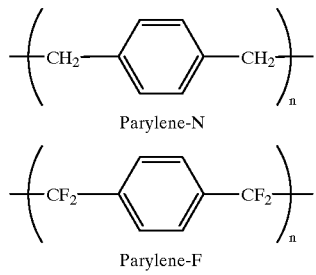

Parylene-N

Parylene-F

Parylene displays a dielectric constant in the range of from about 2.2 to about 2.4. The use of parylene and/or related materials as interlayer dielectrics require that the dielectric material be easily deposited conformally over typical device topographies. Only then will increased device performance in the microelectronic device structure be realized, such as a VLSI device operating in the giga-hertz range in which the low k material is utilized as an ILD to electrically isolate signal lines, e.g., of copper, from each other.

A major manufacturing issue in the deposition of parylene-based dielectric materials, such as parylene-N, relates to the need for accurate and controlled delivery of the dimeric paraxylylene ([2.2]paracyclophane) as a starting material delivered to the thermal "cracking" chamber. In the cracking zone, reactive monomers and/or radical intermediates are formed for subsequent formation of the desired polymer. Co-reactants, such as cross-linking agents or co-monomers, may be added to form a specific polymer or to tailor the polymer properties, including the modulus, the dielectric constant, the thermal stability and the device performance properties.

Parylene-N films grow on a cooled substrate (at temperatures on the order of –20° C.) in a vacuum environment by condensation of gaseous p-xylylene, a reactive monomer. The monomer, however, is not stable at room temperature conditions, but exists rather in the form of dimers. A vapor stream of the monomer can be readily generated by cracking the dimer vapor that is supplied from a stable crystalline solid dimer source. The dimer cracks at temperatures between 500 and 750° C., with 600° C. typically being employed for such dissociation.

Alternatively, the p-xylylene monomer can be created by cracking analogous compounds that contain a p-xylylene unit or derivative thereof.

Current dimer vaporization approaches employ the sublimation of the solid dimer as a feedstock to a cracking unit. Determined by the nature of a sublimation approach, the material transport rate of this process, however, is difficult to control. As a result, the stream of monomers exiting the cracking unit is not constant with time, which leads to an irreproducible deposition process. Liquid sources for parylene film formation may be vaporized in bubblers, but control of the vapor phase concentration of these low volatility compounds is difficult, and leads to poor reproducibility of the deposition process.

For microelectronic applications, control of the vapor concentration is critical, since it determines the growth rate, conformality of the resulting film, and reproducibility of the film formation process. In such applications, thickness must be tightly controlled for operability and adequate performance characteristics. Another problem associated with systems which couple pyrolysis with sublimation or bubbling is that the process equipment aggregately has a large footprint. For example, the process equipment may occupy an inordinately large volume of clean room space and thereby be undesirable for manufacturing environments.

It would therefore be a significant advance in the art to provide a method and apparatus for conveniently and economically providing low dielectric constant polymeric films such as parylene on a substrate with better reproducibility, and without the attendant problems of the prior art approaches for such film formation.

It therefore is the object of the present invention to provide such method and apparatus for the formation of low dielectric constant polymeric films on microelectronic device substrates, to enhance the device performance and reduce RC time delays.

Other objects and advantages of the present invention will be more fully apparent from the ensuing disclosure and appended claims.

SUMMARY OF THE INVENTION

The present invention in one aspect relates to a method of forming a low dielectric constant polymer film, e.g., a parylene film, on a substrate, including the steps of:

providing a precursor comprising a polymer source reagent; heating the precursor to flash vaporize same; heating the flash vaporized precursor to pyrolytically crack the polymer source reagent, yielding a precursor vapor which includes a polymer source monomer and/or reactive radical species; and contacting the precursor vapor with the substrate under conditions producing condensation of the polymer source monomer and/or reactive radical species, to form a low dielectric constant polymeric film on the substrate.

The precursor in such method may be constituted by a liquid solution wherein the polymer source reagent is dissolved in an organic solvent medium.

In a specific aspect, the present invention relates to a method of forming a low dielectric constant (low k) parylene film on a substrate, by liquid delivery of a precursor therefor. The precursor may be in the form of a neat liquid, or alternatively an organic solution containing the precursor monomer such as a dimeric [2.2]paracyclophane, or an alkyl- and/or halo-substituted derivative thereof. The precursor is subsequently flash vaporized, followed by in-situ pyrolytic "cracking" of the flashed vapor to form the monomer and/or reactive species, and condensation leading to polymerization of the monomer and/or reactive species to form A polymeric film of parylene on the substrate.

In such a method, liquid precursor solution may be supplied at suitable elevated temperature for supply to the vaporizer to effect flash vaporization thereof, as for example by provision of the precursor solution in a temperature controlled oven. Such elevated temperature supply in the case of parylene provides increased solution concentration of the precursor, e.g., dimeric [2.2]paracyclophane. Solvents for the liquid precursor solution include ethers such as tetrahydrofuran (THF), glyme solvents, glycols, alcohols, ketones, aldehydes, amines, aryls, pyridine and other compatible hydrocarbon and oxyhydrocarbyl solvents.

Another aspect of the invention relates to a polymer film growth system, comprised of a source of organic solution containing precursor, e.g., in the case of parylene, dimeric [2.2]paracyclophane, a substituted derivative of dimeric [2.2]paracyclophane, or a chemically analogous liquid material, joined in liquid flow communication with a vaporizer, with the vaporizer in turn joined in vapor flow relationship to a "cracking" zone to generate reactive intermediates and/or monomers and lastly to a deposition chamber constructed and arranged to contact the precursor vapor monomers and/or radicals with the desired substrate to be coated.

In such system, the vaporizer and "cracking" zone may comprise a stacked disc unit, or a tubular porous metal membrane unit, wherein the respective discs or tubular porous metal membrane constitute a thermally conductive high surface area medium serving both as a vaporization matrix and a flow restriction matrix, to induce turbulence in the precursor vapor flow and increase the residence time to realize optimal cracking to the monomer or radical species, as hereinafter more filly described.

Other aspects and features of the present invention will be more filly apparent from the ensuing disclosure and appended claims.

BRIEF DESCRIPTION OF THE DRAWINGS

FIG. 3 is a schematic representation of a stacked disc vaporizer/cracking unit which may be utilized for vaporization and cracking of [2.2]paracyclophane, according to one embodiment of the invention.

FIG. 4 is a schematic representation of a vaporizer/cracking unit for liquid delivery vaporization of [2.2] paracyclophane, according to another embodiment of the invention.

FIG. 5 is a schematic representation of a cross-section of the cracking zone of the vaporizer/cracking unit of FIG. 5.

DETAILED DESCRIPTION OF THE INVENTION, AND PREFERRED EMBODIMENTS THEREOF

Figure 1:
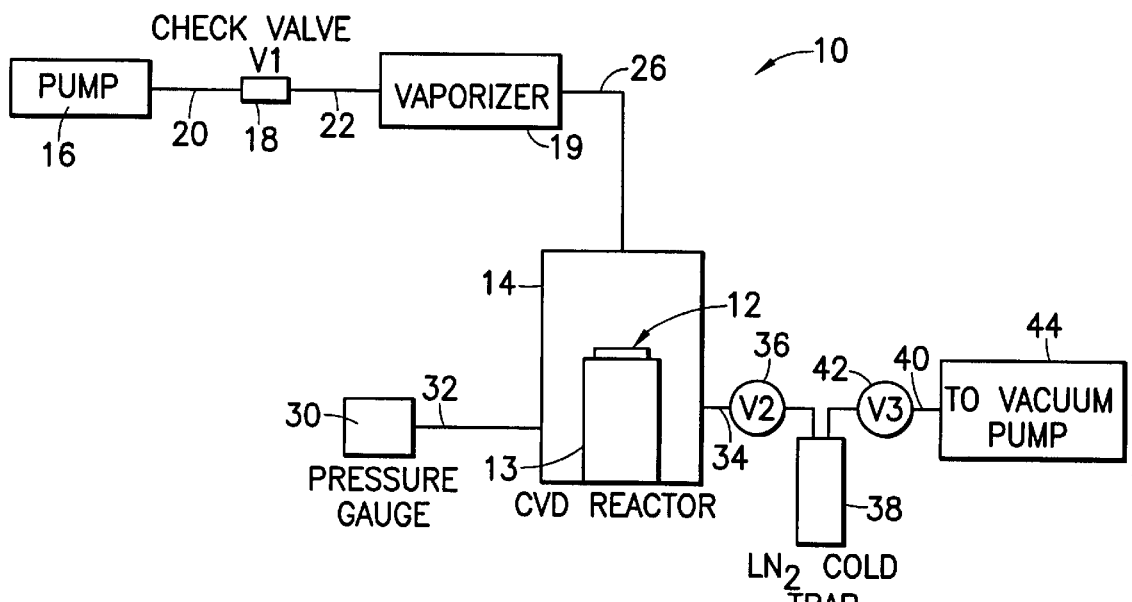
FIG. 1 is a schematic representation of a liquid delivery system, which may be utilized for liquid delivery vaporization, cracking, transport, and deposition of parylene-based precursor to form a low k dielectric film on a substrate.

The vapor-phase deposition of polymeric films such as parylene may be achieved in the practice of the invention by liquid delivery of an organic solution containing precursor, e.g., in the case of parylene, dimeric [2.21]paracyclophane, an alkyl- or halogen-substituted derivative thereof, or a chemically analogous compound that reacts to provide a monomer and/or radical intermediate thereof. The precursor solution is subsequently "flash" vaporized, followed by pyrolytic "cracking" of the dimer to form the monomer and/or reactive species, and by condensation of the monomer and/or reactive species to form the polymeric film, e.g., of parylene or a parylene-like material.

Alternatively, the method of the invention may be carried out wherein the precursor is a liquid. For example, the parylene source reagent may comprise a derivative of p-xylene whose methyl and/or phenyl ring hydrogen substituent sites are at least partially substituted with substituents independently selected from the group consisting of halo, alkoxy, acetyloxo, acetylthio, sulfone, azide and amide, wherein halo substituents may in turn be independently selected from iodo, fluoro, bromo and chloro.

With respect to the formation of parylene films on a substrate, the chemical process is shown below for the vapor-phase decomposition of [2.2]paracyclophane leading to the deposition of a parylene-N film.

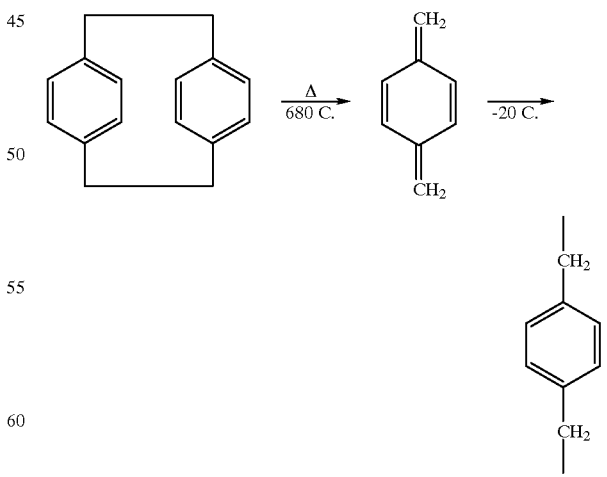

In the practice of the invention as applied to forming a low k parylene film on a substrate, generally a precursor solution of the solid parylene source reagent in an organic solvent medium is provided. The parylene source reagent may be dimeric [2.2]paracyclophane or a substituted derivative of dimeric [2.21]paracyclophane, in which one or more of the extracyclic carbon atoms in the methylene groups (—CH$_2$—) of the dimeric [2.2]paracyclophane molecule is mono- or di-substituted with substituents such as alkyl, halo (iodo, fluoro, bromo, or chloro), alkoxy, or other suitable substituents.

Preferably, such carbon atoms are unsubstituted, or else such carbon atoms are partially or wholly substituted with fluorine to provide a fluorinated or perfluorinated derivative of dimeric [2.2]paracyclophane. This provides a parylene film designated as parylene-F.

The parylene source reagent may also be an analogous compound containing a p-xylylene unit. The structure of the analogous compound may be a p-xylene derivative, in which the protons in the methyl groups or on the phenyl ring are partially or wholly substituted with substituents such as halo (iodo, fluoro, bromo or chloro), alkoxy, acetyloxo, acetylthio, sulfone, azide, amide and others. The analogous compound(s) may be liquid(s) at room temperature. In such a case, however, the neat source reagent may be used and delivered directly to a vaporizer/cracking unit without use of any organic solvent.

The precursor source reagent is subjected to elevated temperature conditions to flash vaporize and subsequently to pyrolytically crack the parylene source reagent and yield a precursor vapor including a parylene source monomer. Flash vaporization of the dimeric [2.2]paracyclophane from the organic solvent precursor solution may be carried out with vaporization conducted at temperatures from about 150° C. to about 300° C., e.g., at 200° C. Cracking is carried out at temperatures on the order of about 500° C. to 750° C., e.g., about 700° C.

The vaporization and cracking may be carried out at any suitable process conditions. The preferred pressure conditions are subatmospheric or near-atmospheric pressure conditions. The temperature, pressure and other conditions may be varied in the process of the invention, to achieve a desired process and film formation result, as may be readily determined within the skill of the art without undue experimentation.

Once the vaporization and cracking have been carried out, the monomers and/or reactive species in the vapor phase are transported to the deposition zone. This deposition zone may comprise a chamber in which the substrate element to be coated with the polymeric film is mounted on a suitable support or susceptor structure, optionally with cooling of the support or susceptor structure.

The substrate element may be maintained at a temperature in the deposition zone that facilitates the condensation of the monomer from the vapor phase onto the substrate, to polymerize in-situ and form the desired polymeric film. The substrate temperature may for example be below ambient (room) temperature, e.g., on the order of −20° C., to effectuate the deposition, although any suitable temperature conditions may be employed in the broad practice of the present invention. Preferred temperature levels for the deposition are from about −60° C. to about 30° C.

In the deposition step, the monomer vapor is contacted with the substrate under conditions producing condensation and polymerization of the source monomer on the substrate element. In the case of parylene film formation, the result is a low k dielectric polymeric film of parylene or a substituted derivative thereof, depending on the identity of the parylene source material.

In some instances of the practice of the present invention, it may be advantageous to add co-reactants during the polymerization process, e.g., co-reactive monomers that are co-polymerizable with the monomer, to produce a wide. array of polymeric materials, thereby facilitating the deposition of polymers with varying dielectric properties and/or thermal stabilities (i.e., cross-link densities).

In the method of the invention as applied to the formation of parylene films, the precursor solution containing the parylene precursor and the organic solvent medium may be made up with any suitable solvent species, including single component solvents, as well as compatible solvent mixtures.

Solvents that may be usefully employed in the broad practice of the invention include hydrocarbyl and oxyhydrocarbyl solvents, including ethers such as tetrahydrofuran (THF) and glyme solvents, glycols, alcohols, ketones, aldehydes, and other compatible hydrocarbon and oxyhydrocarbon solvents. More highly preferred solvents include tetrahydrofuran, furan, tetrahydropyran, pyran, pyridine, benzene, toluene and glyme solvents.

Parylene film formation in the practice of the invention may be carried out in a polymer film growth system in which a supply of the precursor solution comprising a parylene source reagent in an organic solvent medium is arranged for selectively dispensing the precursor solution to the flash vaporizer. The flash vaporizer/cracking unit is arranged to very rapidly volatilize the precursor solution and to pyrolytically crack the parylene source reagent and yield a precursor vapor including a corresponding parylene source monomer.

The flash vaporizer/cracking unit is joined in vapor flow communication with a contacting chamber constructed to hold a substrate therein for contacting with the precursor vapor. The vapor flow communication between the flash vaporizer/cracking unit and the deposition chamber consists of means such as conduits, tubing, pipes, lines, manifolds, flow passages, channels, or any other suitable vapor transport structures by which the vapor formed in the vaporizer unit is flowable to the contacting chamber. Similar means may be used to interconnect the supply or source vessel of the precursor solution with the vaporizer/cracking unit.

In the deposition chamber, appropriate conditions are maintained for contacting of the precursor vapor with the substrate to produce condensation of the parylene source monomer to form a polymeric film of parylene on the substrate. The monomer-containing vapor for such purpose may be introduced in the deposition chamber by a variety of means. These may include vapor nozzles, spray heads, showerhead devices, or the like, to ensure that the vapor is contacted with the substrate element in a manner that results in a desired degree of uniformity, with respect to the product parylene polymer film on the substrate element surface.

The flash vaporizer/cracking unit may be constructed in any suitable manner, but in one preferred embodiment described more fully hereinafter, the flash vaporizer unit comprises an array of stacked disc elements, each formed of a thermally conductive high surface area material. In another preferred embodiment of the flash vaporizer unit, such vaporizer unit comprises a tubular porous metal element formed of a thermally conductive high surface area material.

It will be appreciated that the vaporization and cracking steps may be conducted in separate process units that are interconnected by suitable precursor vapor flow passage means. However, for purposes of maximizing thermal and process efficiency, it is generally preferred to utilize a consolidated unit for carrying out such steps, as disclosed more fully hereinafter.

Considering again the precursor solution containing the parylene source reagent and the organic solvent medium, it may be desirable in some instances to store the precursor solution at elevated temperature conditions, so as to enhance the concentration of the parylene source reagent in the solution. Thus, the solubility of the particular parylene dimer in an organic solvent may be low in a specific solvent, but such solubility increases with increasing solution temperature. For example, the solution may be supplied from a vessel maintained in an oven or thermally controlled enclosure at temperatures of from about 40° C. to about 130° C.

The use of a temperature controlled oven for solution storage and liquid delivery of the solution is therefore one method for providing an increased solution concentration and delivery rate in the practice of the invention, for high efficiency thin-film formation of the parylene polymer.

The liquid delivery techniques usefully employed in the broad practice of the invention include any of the techniques known to those skilled in the art for providing controlled volumes of liquid at suitable temperatures to a heated vaporization zone.

The liquid delivery and flash vaporization method of the present invention achieves a substantial advance in the art over prior art solid source sublimation processes since such prior art processes are limited by the delivery rate of the [2.2]paracyclophane reactant to the "cracking" zone. The liquid delivery and flash vaporization method of the invention therefore enables better control over the delivery rate of the "cracked" monomer and film growth rates of the resulting parylene polymer.

Additionally, modification of the polymeric properties of the product parylene film can be realized by altering the structure of the parylene dimer starting material. For example, substituted derivatives of [2.2]paracyclophane can be synthesized and used to deposit low dielectric constant films with good thermal stability. Various substituted derivatives of [2.2]paracyclophane are described in X. Zhang, B. Wang, R. Tacito, D. Price, J. F. MacDonald, C. Steibruchel, R. J. Gutman, S. P. Muraka and T. P. Chow, New York SCOE *Multi-level Interconnect Review*, November 1994, the disclosure of which hereby is incorporated herein by reference in its entirety.

Preferred derivatives of [2.2]paracyclophane include fluorinated [2.2]paracyclophane precursors. An illustrative chemical sequence for fluorinated [2.2]paracyclophane cracking and vapor-phase deposition of tetrafluoroparylene (parylene-F) film is shown below.

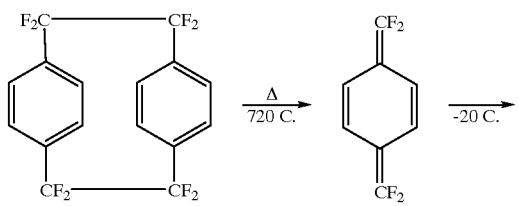

-continued

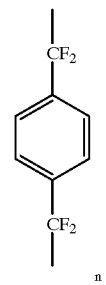

Using the liquid delivery approach, controlled delivery of precursor and fast growth rates of parylene films are readily achieved, as required for single wafer microelectronics applications.

As an example of a specific embodiment of the method of the present invention, a tetrahydrofuran solution containing dimeric [2.2]paracyclophane is flowed at suitable flow rate to a stacked frit vaporizer/cracking unit including a vaporizer zone and a cracking zone. The solution is flash vaporized in the vaporizer zone of the vaporizer/cracking unit at a temperature of about 200° C., followed by cracking the dimeric [2.2]paracyclophane into reactive monomer species in the cracking zone of the vaporizer/cracking unit at a temperature of about 700° C. The cracked vapor comprising the monomer species then is flowed into a contacting chamber for contact of a cooled substrate therein, e.g., at a temperature of about −20° C., with the reactive monomer species of the dimeric [2.2]paracyclophane. The contacting chamber is suitably maintained at a pressure of from about 4 to about 7 Torr, to produce condensation of the reactive monomer species and form a polymeric film of parylene on the substrate.

It will be appreciated that the method of the invention may be widely varied in practice, as regards the pressures, temperatures, flow rates and precursor compositions employed.

Referring now to the drawings, FIG. 1 is a schematic representation of an illustrative process system 10 for the liquid delivery, vaporization and transport of a parylene precursor, e.g., a THF solution of [2.2]paracyclophane, to form a low k dielectric film on a substrate 12 mounted on a support structure 13 in the deposition chamber 14.

In this system, the pump 16 is connected to the check valve 18 by a precursor solution flow line 20, which may for example comprise a length of Teflon® tubing. The check valve 18 is connected to the vaporizer/cracking unit 19 by a flow line 22, which may for example comprise a stainless steel capillary tube. A vapor flow line 26, e.g., a flexible stainless steel tube, connects the vaporizer to the deposition chamber 14, which may for example comprise a quartz bell-jar CVD reactor.

The deposition chamber 14 is connected to a pressure gauge 30 by pressure tap line 32, to monitor the pressure in the deposition chamber during operation. The chamber 14 is also connected by line 34 containing flow control valve 36 to liquid nitrogen cold trap 38. The liquid nitrogen cold trap 38 is in turn connected by line 40 containing flow control valve 42 to the vacuum pump 44.

In operation, the entire system may be evacuated to low pressure, e.g., 0.8 Torr, following which the vaporizer/cracking unit and the stainless steel tubing may be heated to elevated temperature. The vaporizer/cracking unit and lines may be heated for such purpose using tubular furnace and heating tape respectively, and the temperatures are measured and controlled by thermocouples and standard temperature controllers.

The gas-phase deposition of parylene and/or similar polymeric films can therefore be achieved in the practice of the present invention via liquid delivery of an organic solution containing the solid dimer di-p-xylene, subsequent "flash" vaporization, "in-situ" pyrolytic "cracking" of the dimer to form the reactive monomer, condensation, and polymerization of the monomer to form polymeric films of parylene.

Figure 2:
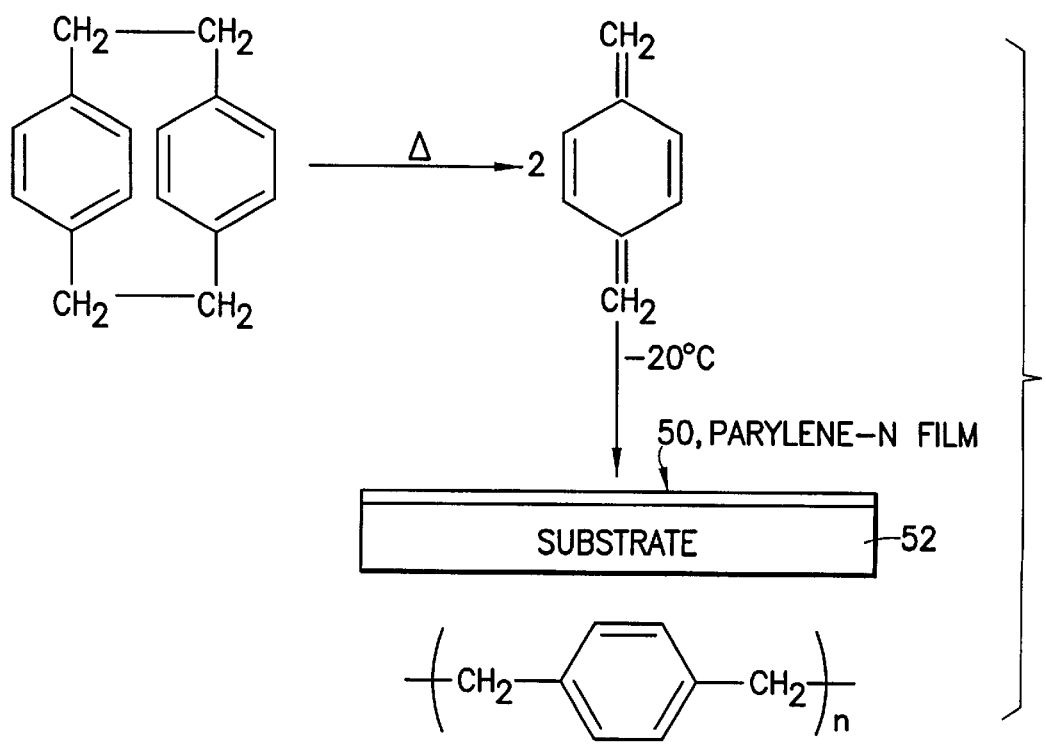
FIG. 2 is a schematic representation of the chemistry associated with the formation of a parylene-N film on a substrate element.

The reaction scheme and product film of parylene-N are shown in FIG. 2, wherein the starting material [2.2] paracyclophane is shown being converted under elevated temperature cracking conditions to the corresponding paracyclophane monomer. The reactive monomer in turn, under low temperature condensation/polymerization conditions, yields a parylene-N film 50 being formed onto the substrate 52.

In addition to [2.2]paracyclophane, compounds analogous to di-p-xylene that are liquids at room temperature and that crack into the reactive monomer species may be deployed to form parylene polymer films in the broad practice of the present invention.

The liquid source must be converted to a stable flow of p-xylylene monomer or radical species before introduction to the deposition chamber, and such conversion is readily achieved by the use of a vaporizer/cracking unit as described more fully hereinafter.

There are several objectives that the vaporizer/cracking unit must meet. These are summarized as follows:

1) The vaporizer/cracking unit must vaporize the incoming liquid feedstock and provide a constant and stable stream of vaporized dimer or other source of the monomer species.

An organic solution containing the di-p-xylylene dimer, or a liquid source of an analogous compound that contains a p-xylylene unit, is injected into the vaporizer/cracking unit. Liquid flow rates for this purpose may for example be from about 0.01 ml/min to about 10 mL/min, in the vaporizer/cracking units hereafter described. The vaporizer/cracking unit must completely vaporize the liquid feed stream.

Liquid delivery with flash vaporization provides a major advance over sublimation or bubbling because of the improved control over the feed rate of the source reagent and the resulting vapor concentration. Typically the vaporization process is carried out at 200° C., and is often conducted with a carrier gas.

Vapor pressures characteristic of representative source chemicals for the parylene-N film growth process are summarized in Table 1 below.

TABLE 1

| Temperature (degrees C.) | Di-p-xylylene (Torr) | Liquid sources (Torr) |
|---|---|---|
| 50 | .03 | 75 |
| 75 | .3 | 140 |
| 100 | 3 | 200 |
| 150 | 103 | |

2) The vaporizer/cracking unit must crack or pyrolyze the di-p-xylylene vapor stream into reactive p-xylylene monomer and/or radical species.

A typical organic polymer cracking process will occur if the vapor temperature is between about 500° C. and about 700° C., with temperatures in the vicinity of 600° C. being preferred. It is important to efficiently crack all of the dimer and to maintain a constant and controlled vapor stream of p-xylylene monomer. In order to ensure complete cracking of the vapor stream, the residence time of the vapor in the cracking zone must be maximized, and thermal gradients across the vapor stream must be minimized.

The following techniques are usefully employed to increase residence time:

a) The pressure in the cracking zone should be kept as high as possible within overall process constraints. By placement of a flow restriction element in the vapor flow path of the cracking zone, the average residence time that a molecule spends in the hot cracking zone is increased, compared to the case where no flow restriction element is present. This is due to the molecular density of the vapor in a fixed volume being a function of the pressure. Molecules enter and leave the fixed cracking volume at the same rate as determined by the system conductance and pumping speed, but at higher pressure there will be more molecules in the cracking zone. On average, a molecule will stay in the hold-up volume of the cracking zone longer, with increasing pressure of the hold-up volume. The pressure in the upstream vaporization zone must be below the vapor pressure of the precursor to prevent condensation, however. Vapor pressure of the monomer is assumed to be lower than the vapor pressure of the dimer and other source chemicals. Another pressure constraint is imposed by the organic solvent used in the precursor composition. The pressure in the cracking zone should be kept below approximately 100 Torr to prevent the formation of soot from decomposition of the solvent.

Because the vapor pressure is a strong function of temperature, it is desirable to have the vaporization and cracking zones isolated from one another. For a controllable vaporization process, the temperature of the vaporization zone is preferably maintained at approximately 200° C. This is much cooler than the cracking zone, which is preferably maintained at approximately 600° C. If a higher temperature, such as the cracking temperature, is used in the vaporization zone, the vapor phase concentration of reactive monomer species would be less uniform in the system and vary more with time, because of the difficulty of maintaining constant conditions (temperature and pressure) at the vaporization surface. Providing proper temperature gradients in the system between the vaporization and cracking zones is as important as providing proper pressure gradients in the system.

A further constraint on the cracking zone pressure is that the outlet pressure must be compatible with the film growth process pressure. In order to grow conformal coatings of parylene-N, the growth must be performed at vacuum pressures (typically on the order of 100 millitorr) with the substrate preferably being within the temperature range of about −50° C. to 25° C. The vaporization/cracking unit must therefore provide an output in this pressure range. The vacuum character of the process facilitates the vaporization, but inhibits the cracking operation because of the decreased residence time.

b) The fluid flow path length should be as long as possible in the cracking (high temperature) zone.

The vaporizer/cracking unit should also be designed to provide a vapor stream with a uniform radial temperature gradient across the flow stream, to yield the most uniform generation of monomer or reactive species. To minimize thermal gradients, and hence improve control of the vapor stream composition, the following techniques may be implemented:

vapor passages should be employed that have small effective diameters, e.g., of micron dimensions;

turbulent flow should be induced; and mixing of the vapor stream should be induced.

Two illustrative vaporizer/cracker unit designs based on flash vaporization technology are discussed hereinafter. Both of these designs employ a thermally conductive, high surface area element as a vaporization structure and as a flow restriction structure, to increase the residence time of the vapor in the cracking zone and to induce turbulence in the vapor stream.

Although the ensuing discussion of porous media is directed to porous metal media formed by powder metallurgy, the porous media could be formed of materials such as micro-channeled media, wool, sponge, collapsed screen matrix elements formed from a metal, or any other high thermal conductivity material of suitable form.

The first illustrative design of a precursor solution vaporizer/cracker unit 60 is shown in FIG. 3 and includes an array of porous metal disks 65 placed in series along a tube 61. The disks create pressure drops, and induce localized turbulence as the vapor flows through the medium of each disk. The disks may have identical or graded porosity to permit management of the pressure profile.

On the exit of the fluid from the porous medium, the flow will approximate plug flow; it will have a uniform velocity profile, and a more uniformn thermal profile. The porous metal disks are placed close enough together to prevent the development of lamninar flow following passage of the vapor through the porous metal membrane. The colder temperature and the shorter residence time present in the center of a laminar vapor flow stream would allow un-cracked dimer to pass. As a result, reactive monomer yield would be very low. The provision of a unit maintaining plug flow conditions in operation is therefore a very important aspect of the preferred practice of the present invention.

In the FIG. 3 vaporizer/cracking unit, the containment tube 61 serves as a housing defining an interior fluid flow passage therethrough. A capillary tube 62 injects the liquid precursor source reagent onto a porous metal membrane element 64. The liquid may impinge directly or be sprayed onto the porous metal membrane element 64.

A carrier gas inlet 63 communicates with the containment tube 61 to supply preheated carrier gas to the system. The porous metal membrane element 64 has a high surface area from which the injected liquid can vaporize. This porous metal membrane element 64 is positioned at an area in the tube where the temperature is approximately 200° C.

A series of metal disks 65 are mounted in longitudinally spaced-apart relationship to one another along the length of the interior passage bounded by containment tube 61. The metal disks 65 cause localized turbulence, thereby enhancing thermal uniformity, reestablishing plug flow, and setting up pressure drops which increase residence time in the cracking zone.

A smaller diameter tube 66 is provided at the discharge end of the main containment tube 61, as shown, for discharging cracked precursor vapor from the vaporizer/cracker unit 60.

The main containment tube 61 may be disposed in a tube furnace 67 for maintaining suitable temperatures for the vaporization and cracking operations.

In the FIG. 3 vaporizer/cracker unit, the temperature upstream of the porous metal membrane 64 may therefore be on the order of 200° C. and the temperature downstream of the porous metal membrane 64 may be on the order of 600° C.

Another design of a vaporizer/cracker unit 70 is shown in FIG. 4. This design is different than the FIG. 3 design in that the vapor is forced to flow axially through the pores of a tubular porous metal membrane throughout the cracking zone. This arrangement helps to maintain turbulence, increase molecular collisions, improve heat transfer, and manage the pressure gradient.

The FIG. 4 vaporizer/cracking unit 70 comprises a containment tube 71, and a capillary tube 72 that injects the source chemistry onto a porous metal membrane 74. A carrier gas inlet 73 supplies preheated carrier gas to the system.

The porous metal membrane 74 provides a high surface area from which the injected liquid can vaporize. This membrane is positioned at an area in the tube where the temperature is approximately 200° C.

A coarse porous metal disk 75 is provided downstream of the porous metal membrane 74, and acts as a radiation shield. The system features a cylindrical porous metal medium 76 with a solid core 84 that is press fit into the containment tube. This medium 76 serves as the cracking zone for the vaporizer/cracking unit.

The medium 76 includes thousands of interconnected capillary pores. As the vapor passes through these pores, it is heated to approximately 600° C. and cracked to the reactive monomer and/or radical species. The large surface area to volume ratio of this medium 76 maximizes heat transfer from the metal walls to the gas. Since the distance that energy has to travel through the porous medium is small, the porous material temperature stays uniform.

The porous medium 76 may be of any suitable material of construction, e.g., stainless steel, and may be fabricated by sintered metal or powdered metal techniques to provide a porous matrix element having suitable porosity, tortuosity and void volume characteristics. In like manner, the disk elements and membrane elements of the vaporizer/cracking units may be formed of any suitable conductive metal and by any appropriate processing techniques.

Using the porous medium 76 as illustratively shown in FIG. 4 also provides a gradual pressure drop from inlet to outlet. At the entrance to the tube, the pressure is high and residence times are long. The pressure gradually reduces as the vapor passes through the porous medium. This gradual pressure reduction is preferred over a more sudden pressure drop such as that occurring for example across an orifice. As a gas expands it must absorb some amount of heat to maintain its temperature, and even more to increase in temperature. By flowing the vapor through a continuous, conductive, "heating" medium, energy is efficiently transferred to the vapor and the added energy requirements associated with the gas expansion can be readily supplied.

The cracking section of the vaporizer embodiment shown in FIG. 4 may be fabricated by pressing a metal core 84 into a commercially available porous metal cylinder 76, and in turn pressing this subassembly into a correspondingly-sized bore in a containment tube 71. These components of the cracking assembly are desirably chosen and fabricated so that the core element and exterior tube maintain intimate contact with the porous cylinder and seal the pores on the interior and exterior surfaces of the porous tube even at high temperatures. Preferred materials of construction for the porous cylinder 76 and the other porous elements in the vaporizer/cracking unit include 316L stainless steel, nickel, and tantalum-plated stainless steel. The porosity of the porous metal cylinder 76 is chosen so as to give appropriate pressure drops under applicable process flow conditions and in turn to optimize precursor residence times and maximize the cracking efficiency.

The cross-section 80 of a region in the cracking zone is shown in FIG. 5, as including the solid core 82 surrounded by the porous metal cylinder 76 and the outer containment tube 71. The cylindrical porous metal medium therefore serves as a high efficiency cracking zone. As the vapor passes through its pores, the vapor is heated and cracked to the reactive monomer or radical species.

In one specific illustrative embodiment, for the cracking of precursor vapor for the deposition of parylene-N polymeric films, the porous cylinder 76 may be fabricated from a 100 micron pore size porous 316L stainless steel medium, and may have a 0.63 inch outside diameter and a 0.48 inch inside diameter, with a length of approximately 2 inches.

Figure 6:
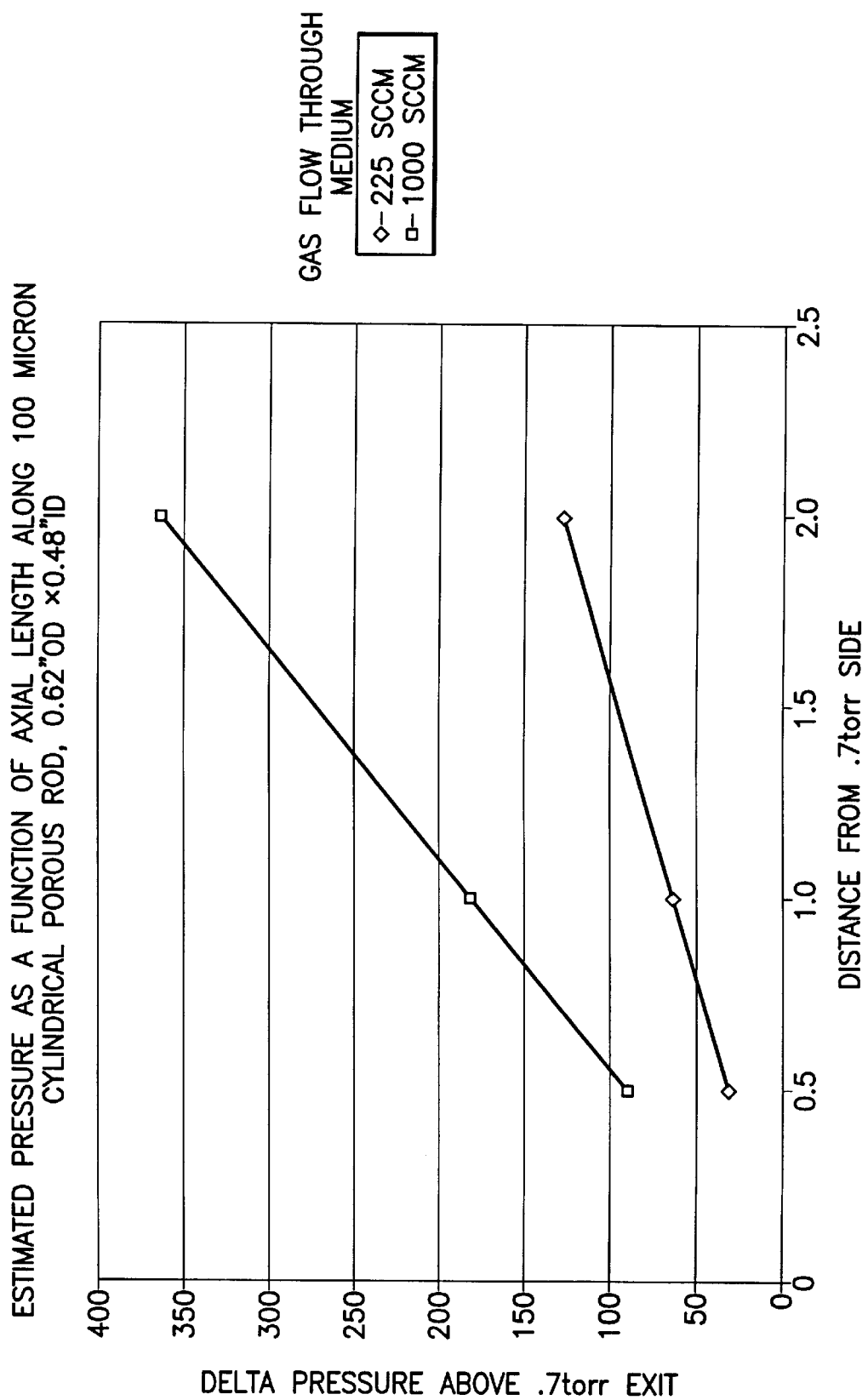
FIG. 6 is a plot of calculated pressure as a finction of axial length along a 100-micron cylindrical porous rod vaporizer/cracking member.

FIG. 6 shows a plot of the approximate pressure drop expected across such a porous cylindrical medium as a function of the length of the cylindrical medium, for a representative parylene-N film growth. The plotted points are based on conductance measurements made with a 1/16" thick porous stainless steel disk with a porosity of 100 microns, and a gas temperature of 200° C. This plot ignores the effects of the expansion of the vapor caused by heating and entrance and exit effects, but it gives a rough estimate of the pressure profile.

The vaporizer/cracking unit designs described with reference to FIGS. 3–5 represent compact, inexpensive, efficient configurations for generating vapor streams of parylene monomer or reactive species required to produce conformal parylene-N thin films suitable for interlayer dielectrics. These designs achieve effective control of vapor phase concentrations, good vapor phase uniformity of reactive species, and efficient heating of the vapor as required to achieve cracking. They also represent small equipment footprints and excellent energy efficiency.

The features and advantages of the present invention are more fully shown by the following non-limiting examples wherein all parts and percentages are by weight, unless otherwise expressly stated.

EXAMPLE 1

In a specific operation of a system of the type shown and described with reference to FIG. 1 hereof, the transport and vaporization of the [2.2]paracyclophane were examined using the vaporizer/cracking unit via liquid delivery. Silicon wafers were used to collect the condensed effluent from the vaporizer for infrared (IR) spectral analysis to determine the identity of the condensate.

The precursor solution included [2.2]paracyclophane dissolved in THF at room temperature with a saturated solution concentration of 0.038 M; 20 mL of this precursor solution at room temperature was pumped into a standard frit-type vaporizer/cracker (heated to 150° C.) at the rate of 0.5 mL/min. The system pressure increased to ~2 Torr from 0.8 Torr during the run. The liquid nitrogen cold trap 38 positioned upstream of the vacuum pump 44 collected the transported materials. After the experiment was completed, a white, solid deposit was observed on the walls of the quartz reactor and the surface of the silicon wafer.

Figure 7:
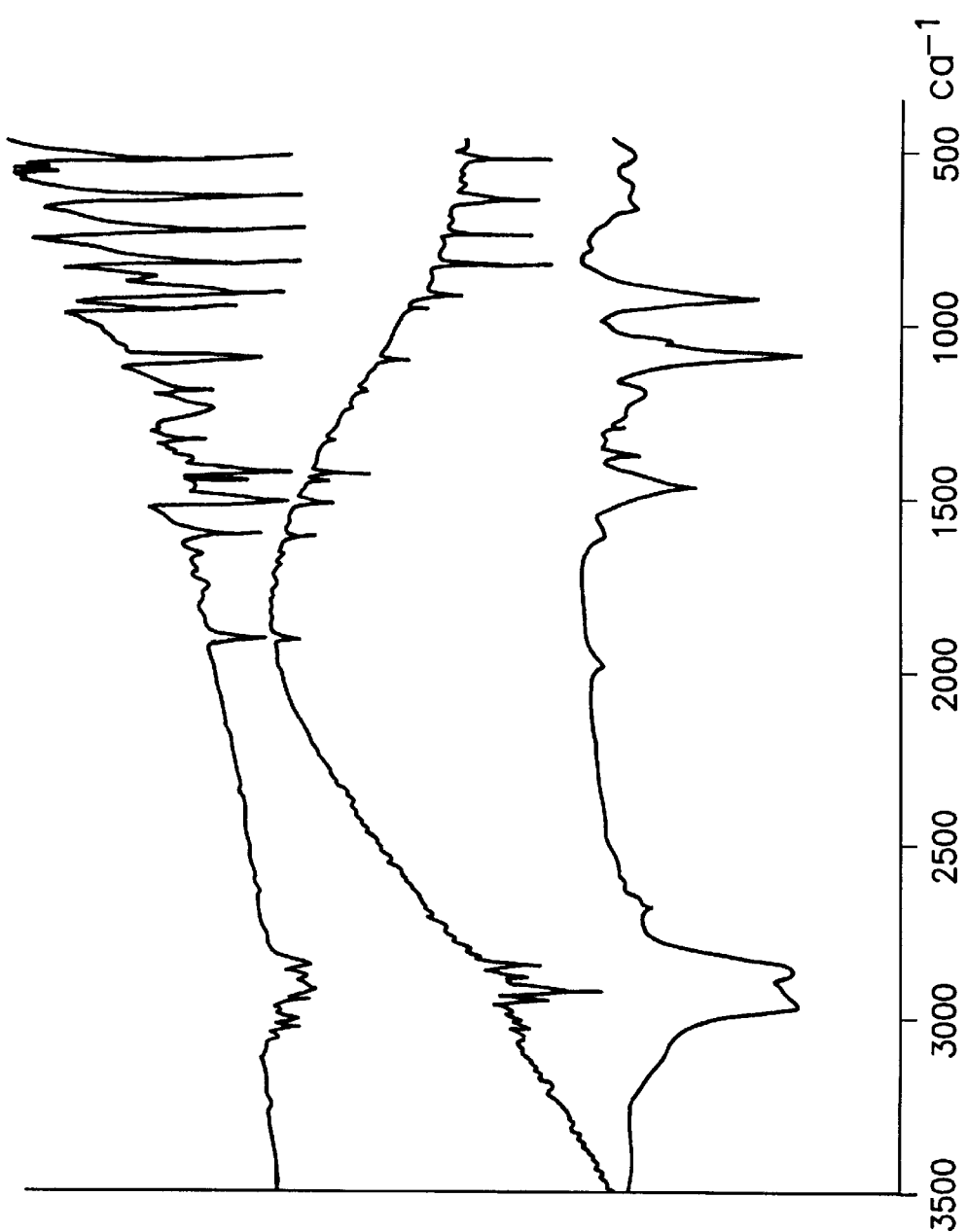
FIG. 7 is a graph of FTIR spectra for a [2.2] paracyclophane starting material, a condensed paracyclophane material after thermal transport of a tetrahydrofuran solution at 150° C., and tetrahydrofaran solvent employed in preparing a precursor solution for liquid delivery.

To determine the identity of the condensed white deposit, infrared (IR) spectroscopy was used to analyze the solid. The white condensate on the silicon wafer was analyzed by FTIR versus a blanket silicon wafer used as a reference. FIG. 7 shows FTIR spectra obtained for (top spectrum) [2.2] paracyclophane starting material, (middle spectrum) condensed [2.2]paracyclophane after thermal transport of a THF solution at 150° C., and (bottom spectrum) THF solvent used in the preparation of the solution for liquid delivery.

From these FTIR data, it was concluded that the white solid collected on the silicon wafer during this experiment was [2.2]paracyclophane. It was clean and free of significant contamination, indicative of effective transport and vaporization of this precursor using the liquid delivery approach.

No detectable incorporation of THF was observed in the white solid condensed on the silicon wafer, based on the FTIR comparison with the THF solvent. It appeared that the solvent was pumped away completely during the transport process of the [2.2]paracyclophane. That is, no solvent contamination was present in the condensed solid film (THF was not detected).

EXAMPLE 2

In a system of the general type shown in FIG. 1 hereof, a THF solution-containing [2.2]paracyclophane was flowed to a stacked frit vaporizer/cracking unit. The thermal "cracking" zone was held at 700° C., and the vaporizer temperature was approximately 200° C. The flow rate was 0.5 mL/min, and the solution concentration was 0.038 M. The cracked precursor vapor then was contacted with a cooled (–20° C.) substrate surface for film deposition.

The deposition chamber pressure varied between 4 and 7 Torr during the run. 30 mL of the solution was pumped to the "vaporizer/cracking" zone, and the exiting vapor was condensed onto a silicon wafer at –20° C. The substrate was removed from the reactor. Cleavage of the substrate provided visual confirmation that a polymeric film was formed on the substrate. Further, some of the film could be peeled from the substrate surface. The film on the silicon wafer was analyzed by FTIR spectroscopy.

Figure 8:
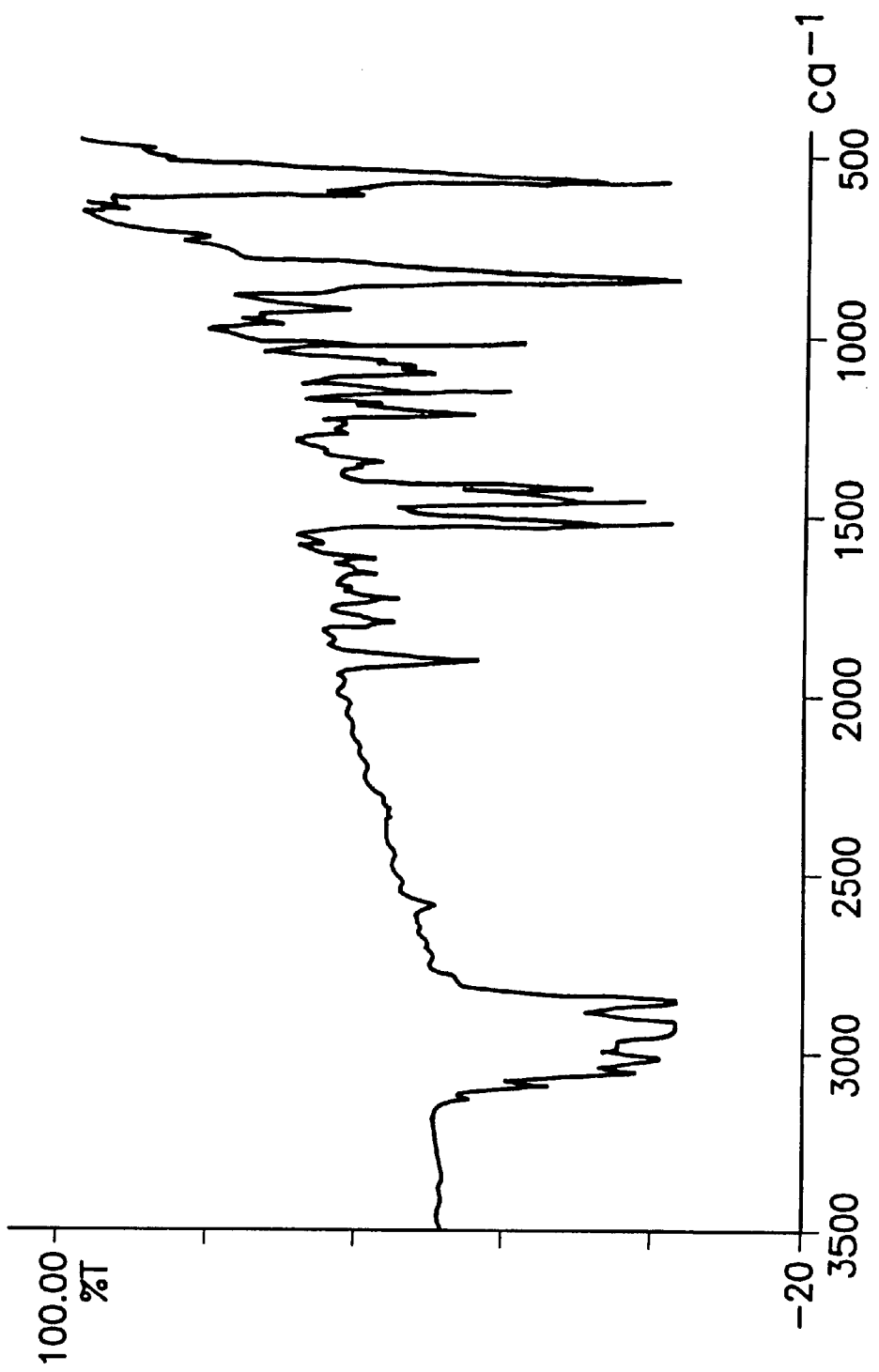
FIG. 8 is an FTIR spectrum obtained for a thin film deposited from a tetrahydrofuran solution of [2.2] paracyclophane after thermal transport, in-situ cracking at 700° C., and condensation/polymerization of the reactive monomers at −20° C. to produce a parylene film.

FIG. 8 shows the FTIR spectrum obtained for the resulting thin film deposited from the THF solution of [2.2] paracyclophane after thermal transport, in-situ "cracking" at 700° C. and condensation/polymerization of the reactants at –20° C. The spectrum showed the characteristic IR absorption bands of parylene-N polymer.

These results demonstrate the ability of the parylene film formation process of the present invention to form polymeric material on a substrate upon condensation/polymerization of the cracked precursor vapor comprising the p-xylylene monomer.

The process of the invention while particularly usefullly employed for formation of parylene films may also be utilized to form other low k dielectric film coatings on substrates, by a corresponding methodology, viz., of liquid delivery, vaporization, in-situ "pyrolysis" of the reactant to provide reactive species for subsequent polymerization, and deposition and formation of the low k dielectric polymer on the substrate (e.g., an integrated circuit or other microelectronic device structure).

Accordingly, while the invention has been shown and described herein with reference to various illustrative features, aspects and embodiments, it will be appreciated that the invention is susceptible to being embodied in other forms and variations, as will readily suggest themselves to those of ordinary skill in the art, based on the disclosure herein. The invention therefore is to be construed and interpreted as including within its spirit and scope all such alternative forms, variations, features, aspects and embodiments.

What is claimed is:

1. A parylene film growth system for forming a parylene film on a substrate, said system comprising:
   a supply of a precursor comprising a parylene source reagent;
   a flash vaporizer and pyrolytic cracking unit for flash vaporizing the precursor to form flash vaporized precursor and pyrolytically cracking the flash vaporized precursor to yield a precursor vapor including a parylene source monomer and/or reactive radical species;

means for flowing the precursor from the supply thereof to the flash vaporizer and pyrolytic cracking unit, for flash vaporization therein to form the flash vaporized precursor and pyrolytic cracking of the flash vaporized precursor to form precursor vapor including the parylene source monomer and/or reactive radical species;

a contacting chamber constructed to hold a substrate therein for contacting with the precursor vapor; and means for flowing the precursor vapor from the flash vaporizer and pyrolytic cracking unit to the contacting chamber for contact of the precursor vapor with the substrate under conditions producing condensation of the parylene-source monomer and/or reactive radical species to form a polymeric film of parylene on the substrate.

2. The parylene film growth system, according to claim 1, wherein the precursor comprises a liquid solution wherein the parylene source reagent is dissolved in an organic solvent medium.

3. The parylene film growth system according to claim 1, wherein the precursor is a liquid and the parylene source reagent comprises a derivative of p-xylene whose methyl and/or phenyl ring hydrogen substituent sites are at least partially substituted with substituents independently selected from the group consisting of halo, alkoxy, acetyloxo, acetylthio, sulfone, azide and amide.

4. The parylene film growth system according to claim 2, wherein the parylene source reagent is selected from the group consisting of dimeric [2.2]paracyclophane and substituted derivatives thereof having substituents independently selected from the group consisting of alkyl substituents and halogen substituents.

5. The parylene film growth system according to claim 2, wherein the flash vaporizer and pyrolytic cracking unit comprises an array of stacked disc elements, each formed of a thermally conductive high surface area material, and arranged for contacting with precursor solution and/or precursor solution vapor for heating thereof.

6. The parylene film growth system according to claim 2, wherein the flash vaporizer and pyrolytic cracking unit comprises a tubular porous metal element formed of a thermally conductive high surface area material for pyrolytic cracking of the flash vaporized precursor.

7. A parylene film growth system according to claim 2, further comprising a vacuum pump coupled in pumping relationship to the deposition chamber for maintaining sub-atmospheric pressure conditions therein.

8. A polymer film growth system for forming a low dielectric constant film on a substrate, said system comprising:

a supply of a precursor cbmprising a polymer source reagent;

a flash vaporizer and pyrolytic cracking unit for flash vaporizing the precursor to form flash vaporized precursor and pyrolytically cracking the flash vaporized precursor to yield a precursor vapor including a parylene source monomer and/or reactive radical species;

means for flowing the precursor from the supply thereof to the flash vaporizer and pyrolytic cracking unit, for flash vaporization therein to form the flash vaporized precursor and pyrolytic cracking of the flash vaporized precursor to form precursor vapor including the parylene source monomer and/or reactive radical species;

a contacting chamber constructed to hold a substrate therein for contacting with the precursor vapor; and means for flowing the precursor vapor from the flash vaporizer and pyrolytic cracking unit to the contacting chamber for contact of the precursor vapor with the substrate under conditions producing condensation of the polymer source monomer and/or reactive radical species to form a low dielectric constant polymeric film on the substrate.

9. The polymer film growth system according to claim 8, wherein the precursor comprises a liquid solution wherein the polymer source reagent is dissolved in an organic solvent medium.

10. A liquid precursor vaporization and thermal cracking apparatus, comprising:

an elongated housing defining a fluid flow passage therethrough with an inlet for introduction of liquid precursor to the fluid flow passage and an outlet for discharge of thermally cracked precursor from the fluid flow passage;

a porous metal membrane at a proximal portion of the housing fluid flow passage for vaporization of liquid precursor contacted therewith when said porous metal membrane is heated;

an array of porous metal vapor flow restriction elements, each in longitudinally spaced-apart relationship to the others, at a portion of the-housing fluid flow passage distal to the porous metal membrane; and means for heating the porous metal membrane and the porous metal vapor heating elements.

11. A liquid precursor vaporization and thermal cracking apparatus, comprising:

an elongated housing defining a fluid flow passage therethrough with an inlet for introduction of liquid precursor to the fluid flow passage and an outlet for discharge of vaporized and thermally cracked fluid from the fluid flow passage;

a porous metal membrane at a proximal portion of the housing fluid flow passage for vaporization of liquid precursor contacted therewith when the porous metal membrane is heated;

a cracking assembly at a portion of the housing fluid flow passage distal to the porous metal membrane, wherein the cracking assembly comprises an elongated porous cylindrical element with inner and outer cylindrical surfaces, arranged with the outer cylindrical surface in abutting contact in the fluid flow passage with the housing, and a solid core member having an outer surface in abutting contact with the inner cylindrical surface of the porous cylindrical element, whereby vapor from vaporization of the liquid precursor is forced to flow longitudinally through the porous cylindrical element to the outlet of the housing, for cracking of the vapor in the porous cylindrical element; and means for heating the porous metal membrane and the cracking assembly.

12. A liquid precursor solution vaporization and thermal cracking apparatus, comprising:

an elongated housing defining a fluid flow passage therethrough with an inlet for introduction of liquid precursor to the fluid flow passage and an outlet for discharge of vaporized and thermally cracked fluid from the fluid flow passage;

a porous metal membrane at a proximal portion of the housing fluid flow passage for vaporization of liquid precursor contacted therewith when the porous metal membrane is heated;

a cracking assembly at a portion of the housing fluid flow passage distal to the porous metal membrane, wherein the cracking assembly comprises an elongate porous cylindrical element with inner and outer cylindrical surfaces, arranged with the outer cylindrical surface in abutting contact in the fluid flow passage with the housing, and a solid core member having an outer surface in abutting contact with the inner cylindrical surface of the porous cylindrical element, whereby vapor from vaporization of the liquid precursor is forced to flow longitudinally through the porous cylindrical element to the outlet of the housing, for cracking of the vapor in the porous cylindrical element; and means for heating the porous metal membrane and the cracking assembly.

\* \* \* \* \*